United States Patent
Sawano et al.

(10) Patent No.: US 10,998,712 B2
(45) Date of Patent: May 4, 2021

(54) POWER SUPPLY CONTROL APPARATUS HAVING A WIRE PROTECTION UNIT

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Shunichi Sawano, Mie (JP); Yuuki Sugisawa, Mie (JP); Kota Oda, Mie (JP); Keisuke Mase, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 226 days.

(21) Appl. No.: 16/063,820

(22) PCT Filed: Jan. 13, 2017

(86) PCT No.: PCT/JP2017/001022
§ 371 (c)(1),
(2) Date: Jun. 19, 2018

(87) PCT Pub. No.: WO2017/122781
PCT Pub. Date: Jul. 20, 2017

(65) Prior Publication Data
US 2019/0260200 A1    Aug. 22, 2019

(30) Foreign Application Priority Data

Jan. 15, 2016  (JP) .............................. JP2016-006371

(51) Int. Cl.
*H02H 7/12*    (2006.01)
*H02M 1/08*    (2006.01)
(Continued)

(52) U.S. Cl.
CPC .......... *H02H 7/1213* (2013.01); *H02H 3/087* (2013.01); *H02H 5/04* (2013.01);
(Continued)

(58) Field of Classification Search
CPC ...... H02H 7/1213; H02H 3/087; H02H 6/005; H02H 5/04; H02M 1/32; H02M 1/08;
(Continued)

(56) References Cited

U.S. PATENT DOCUMENTS 6,011,416 A * 1/2000 Mizuno .............. H03K 17/0822
327/108
2010/0188134 A1 * 7/2010 Pidutti ..................... H02M 1/32
327/427

(Continued)

FOREIGN PATENT DOCUMENTS

EP  3386054 A1  10/2018
JP  4624400 B2   2/2011
(Continued)

OTHER PUBLICATIONS

Search Report for PCT/JP2017/001022, dated Feb. 28, 2017.
Extended European Search Report, Application No. EP 17738533.3, dated Jan. 2, 2019.

*Primary Examiner* — Thienvu V Tran
*Assistant Examiner* — Shahzeb K Ahmad
(74) *Attorney, Agent, or Firm* — Honigman LLP

(57) ABSTRACT

A power supply control apparatus includes: a semiconductor switching element switched with PWM control; a PWM signal output unit outputting a PWM signal; a current circuit outputting a current related to a current flowing through the semiconductor switching element; a filter circuit converting the current that is output from the current circuit to a voltage; an overcurrent protection circuit turning off the semiconductor switching element based on a voltage value of the voltage filtered by the filter circuit; a voltage detection unit
(Continued)

detecting the voltage value of the voltage at a timing near an end of a pulse of a PWM signal; a temperature estimation unit estimating, a temperature of an electric wire through which a current flows that also flows through the semiconductor switching element; and an electric wire protection unit turning off the semiconductor switching element based on the temperature estimated by the temperature estimation unit.

2 Claims, 2 Drawing Sheets

(51) Int. Cl.
| | |
|---|---|
| *H02M 3/156* | (2006.01) |
| *H03K 17/082* | (2006.01) |
| *H02M 1/32* | (2007.01) |
| *H02H 5/04* | (2006.01) |
| *H02H 6/00* | (2006.01) |
| *H02H 3/087* | (2006.01) |
| *H02M 1/00* | (2006.01) |
| *H02H 7/08* | (2006.01) |
| *H03K 17/08* | (2006.01) |

(52) U.S. Cl.
CPC ............ *H02H 6/005* (2013.01); *H02M 1/08* (2013.01); *H02M 1/32* (2013.01); *H02M 3/156* (2013.01); *H03K 17/0822* (2013.01); *H02H 7/08* (2013.01); *H02M 2001/0009* (2013.01); *H02M 2001/327* (2013.01); *H03K 2017/0806* (2013.01)

(58) Field of Classification Search
CPC ........... H02M 3/156; H02M 2001/327; H02M 2001/0009; H03K 17/0822
See application file for complete search history.

(56) References Cited

U.S. PATENT DOCUMENTS

| | | | |
|---|---|---|---|
| 2010/0253296 A1* | 10/2010 | Huang | H02M 3/1588 323/225 |
| 2011/0298528 A1* | 12/2011 | Endo | H03K 19/00369 327/512 |
| 2012/0176115 A1* | 7/2012 | Higuchi | H03K 17/08 323/311 |
| 2012/0182004 A1* | 7/2012 | Higuchi | H02M 3/156 323/284 |
| 2013/0294118 A1* | 11/2013 | So | H02M 3/33507 363/21.16 |
| 2014/0145635 A1* | 5/2014 | Chu | H05B 45/37 315/224 |
| 2015/0138682 A1 | 5/2015 | Ueta et al. | |
| 2017/0197566 A1* | 7/2017 | Nakamura | B60R 16/03 |
| 2017/0294918 A1* | 10/2017 | Illing | H03M 1/124 |
| 2018/0041022 A1* | 2/2018 | Fukui | G02F 1/133533 |
| 2018/0287365 A1* | 10/2018 | Djelassi-Tscheck | H03K 17/0822 |

FOREIGN PATENT DOCUMENTS

| | | |
|---|---|---|
| JP | 2012-054804 A | 3/2012 |
| WO | 2012077284 A1 | 6/2012 |

* cited by examiner

POWER SUPPLY CONTROL APPARATUS HAVING A WIRE PROTECTION UNIT

CROSS-REFERENCE TO RELATED APPLICATIONS

This application is the U.S. national stage of PCT/JP2017/001022 filed Jan. 13, 2017, which claims priority of Japanese Patent Application No. 2016-006371 filed on Jan. 15, 2016, which is incorporated herein by reference in its entirety.

FIELD OF THE INVENTION

The present description relates to a power supply control apparatus for controlling power supply by switching a semiconductor switching element on or off.

BACKGROUND OF THE INVENTION

In a vehicle, a power supply control apparatus is installed that supplies a power with a predetermined voltage value from a battery to a load via a semiconductor switching element in which switching is performed with PWM (Pulse Width Modulation) control. In this kind of power supply control apparatus, a microcomputer (or microcontroller) obtains a voltage value of the battery and calculates a duty ratio of the PWM control based on the obtained voltage value and the predetermined voltage value. Then, the microcomputer generates PWM (Pulse Width Modulation) signals based on the calculated duty ratio, and outputs the generated PWM signals. Based on the PWM signals that are output from the microcomputer, a driving circuit switches the semiconductor switching element on or off.

In this kind of power supply control apparatus, an overcurrent self-protection circuit protects the semiconductor switching element by switching off the semiconductor switching element according to a current value of a current flowing through the semiconductor switching element. Also, the microcomputer obtains the current value of the current flowing through the semiconductor switching element, and estimates, based on the obtained current value and a current flow-through time, a temperature of an electric wire through which a current flows that also flows through the semiconductor switching element. Based on the estimated temperature, the microcomputer turns off the semiconductor switching element to protect the electric wire.

FIG. 1 is a graph showing an example of an overcurrent protection characteristic of a conventional power supply control apparatus and a smoke-developing characteristic of an electric wire. In this graph, the value of the current flowing through the electric wire (flow-through current value) is marked on the vertical axis and time or continuous flow-through time of the flow-through current is marked on the horizontal axis. The waveform F shows a load current including an inrush current, with time being marked on the horizontal axis. Any point, given by flow-through current value and flow-through time, on the upper right of an electric-wire smoke-developing characteristic curve C leads to development of smoke in a material covering the electric wire develops smoke due to overheating. The electric-wire smoke-developing characteristic curve C shows an electric-wire temperature at which smoke development starts in the curve that shows the electric-wire temperature in the case where a current flows for the flow-through time.

In this power supply control apparatus, a curve D indicating a cut-off threshold value pertaining to a temperature calculation is defined for a slightly lower temperature (on the lower current side and shorter time side) of the electric-wire smoke-developing characteristic curve C.

In this case, as shown in the electric-wire smoke-developing characteristic C, the larger the flow-through current value is, the shorter the flow-through time for which the electric wire starts to develop smoke is. Also, time for calculating an electric wire temperature is needed. For this reason, the curve D showing the cut-off threshold value obtained by the temperature calculation is not set in the region in which the flow-through time is, for example, 10 milliseconds or shorter.

JP 4624400B discloses an electric wire protection apparatus in which a sense MOSFET (Metal Oxide Semiconductor Field Effect Transistor) in an IPS (Intelligent Power Switch) outputs a sense current that is proportional to a load current, and a microcomputer obtains a sense voltage value generated by the sense current having been current-voltage converted. The microcomputer periodically obtains the sense voltage value and calculates an electric wire temperature based on the obtained sense voltage value. If a flowing current increases due to a short-circuit of a wire harness and the like, a sense voltage rises, and thus the microcomputer determines that the electric wire is in an overheated state and turns off the semiconductor switching element before the calculated electric wire temperature rises and the electric wire starts to develop smoke.

SUMMARY OF THE INVENTION

As a load for which the above-mentioned conventional power supply control apparatus controls power supply, there is a load through which an inrush current F, as shown in FIG. 1, flows when starting. For controlling the supply of power to such a load, it is necessary to set a threshold value E of the overcurrent self-protection circuit high so that the semiconductor switching element does not turn off when the inrush current F flows. However, if the threshold value E of the overcurrent self-protection circuit is set to a high value, a region in which the threshold value E exceeds the electric-wire smoke-developing characteristic C generates in a region in which a cut-off threshold value D (shown in FIG. 1) is not set. In this region, a flow-through current value does not exceed the threshold value E, but there is a possibility that the flow-through current value exceeds the electric-wire smoke-developing characteristic C. In this case, there is a problem that the flow-through current value does not exceed the threshold value E of the overcurrent self-protection circuit and the cut-off threshold value obtained by the temperature calculation (not set), but the electric wire develops smoke because the flow-through current value exceeds the electric-wire smoke-developing characteristic C, and thus the electric wire cannot be protected.

The present description was achieved in light of the foregoing circumstances, and an object of the present description is to provide a power supply control apparatus in which a semiconductor switching element does not turn off when an inrush current flows and the semiconductor switching element can be turned off before reaching to a flow-through current value at which an electric wire starts to develop smoke.

A power supply control apparatus according to the present description includes: a semiconductor switching element configured to be switched with PWM control; a PWM signal output unit configured to output a PWM signal pertaining to the PWM control; a current circuit configured to output a current related to a current flowing through the semiconductor switching element; a filter circuit configured to convert the current that is output from the current circuit to a voltage and to filter the converted voltage; an overcurrent protection circuit configured to turn off the semiconductor switching element based on a voltage value of the voltage filtered by the filter circuit; a voltage detection unit configured to detect the voltage value of the voltage filtered by the filter circuit at a timing near an end of a pulse of the PWM signal; a temperature estimation unit configured to estimate, based on the voltage value detected by the voltage detection unit, a temperature of an electric wire through which a current flows that also flows through the semiconductor switching element; and an electric wire protection unit configured to turn off the semiconductor switching element based on the temperature estimated by the temperature estimation unit.

In this power supply control apparatus, switching of the semiconductor switching element is performed with PWM control and the PWM signal output unit outputs PWM signals pertaining to the PWM control. The current circuit outputs a current related to a current flowing through the semiconductor switching element, and the filter circuit converts the current that is output from the current circuit to a voltage and filters the converted voltage. The overcurrent protection circuit turns off the semiconductor switching element based on the voltage value of the voltage filtered by the filter circuit.

The voltage detection unit detects the voltage value of the voltage filtered by the filter circuit at the timing near the end of each pulse of the PWM signals. The temperature estimation unit estimates, based on the voltage value detected by the voltage detection unit, a temperature of the electric wire through which a current flows that also flows through the semiconductor switching element. The electric wire protection unit turns off the semiconductor switching element based on the temperature estimated by the temperature estimation unit.

In the power supply control apparatus according to the present description, the PWM signal output unit may be configured to output a PWM signal in which an end of a cycle coincides with an end of a pulse.

In the power supply control apparatus according to the present description, the region near the end of the pulse is a period starting at a point in time that is up to 1% of the time of the corresponding cycle prior to the end of the pulse, and ending at that end of the pulse.

In this power supply control apparatus, the region near the end of each pulse of the PWM signals is the period starting at a point in time that is up to 1% of the time of the corresponding cycle prior to the end of the pulse, and ending at that end of the pulse.

According to the present description, a semiconductor switching element does not turn off when an inrush current flows, and the semiconductor switching element can be turned off before reaching to a flow-through current value at which an electric wire develops smoke.

DETAILED DESCRIPTION OF THE PREFERRED EMBODIMENTS

Hereinafter, the present description will be described based on drawings illustrating an embodiment thereof.

Figure 1:
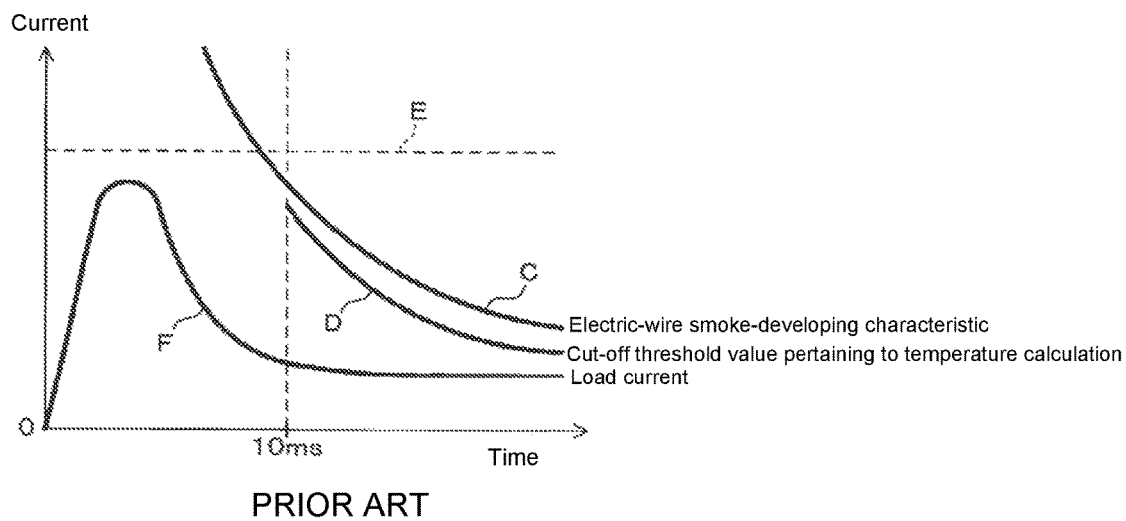
FIG. 1 is a graph showing an example of an overcurrent protection characteristic of a conventional power supply control apparatus and a smoke-developing characteristic of an electric wire.
Figure 2:
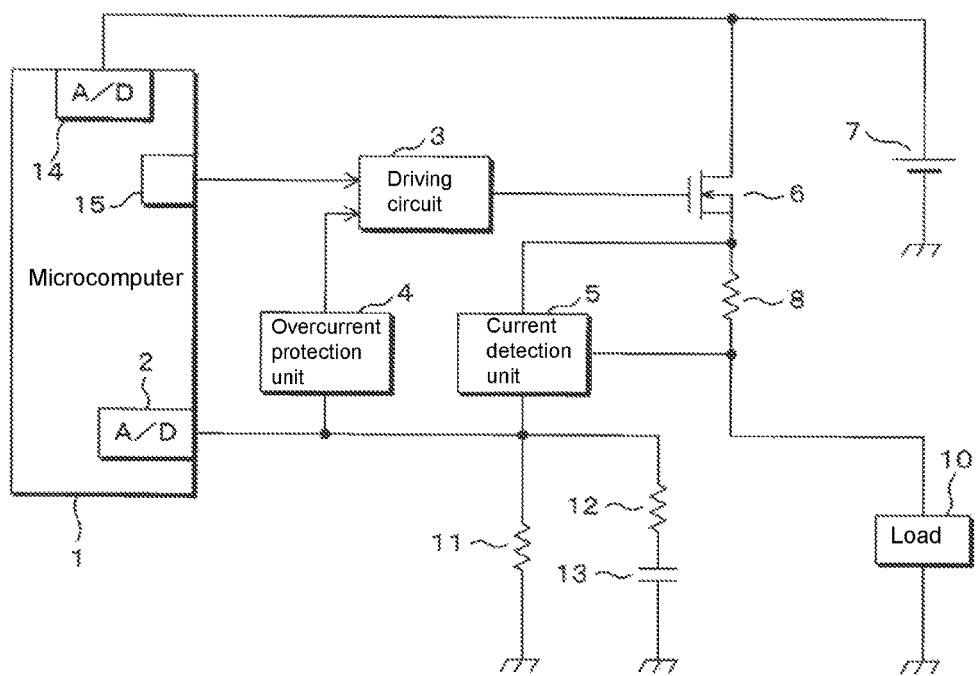
FIG. 2 is a block diagram showing a schematic configuration of an embodiment of a power supply control apparatus.

FIG. 2 is a block diagram showing a schematic configuration of an embodiment of a power supply control apparatus. This power supply control apparatus includes a microcomputer 1, a driving circuit 3, an overcurrent protection unit 4, a current detection unit 5, a semiconductor switching element 6, a shunt resistor 8, resistors 11 and 12, and a capacitor 13. The semiconductor switching element 6 is an N-channel FET (Field Effect Transistor). A plus terminal of a battery 7, which is a power source, is connected to the drain of the semiconductor switching element 6, and a plus terminal of a load 10 is connected to its source via the shunt resistor 8. Minus terminals of the battery 7 and the load 10 are grounded.

The driving circuit 3 is connected to the gate of the semiconductor switching element 6, and the driving circuit 3 switches on or off the semiconductor switching element 6 in response to a PWM signal that is provided from an output terminal 15 of the microcomputer 1. A PWM signal is composed of a high-level voltage and a low-level voltage that is lower than the high-level voltage, and in the PWM signal, a high-level voltage and a low-level voltage are alternatively repeated. If the PWM signal indicates a high-level voltage, the driving circuit 3 turns on the semiconductor switching element 6, and if the PWM signal indicates a low-level voltage, the driving circuit 3 turns off the semiconductor switching element 6. In this manner, the switching of the semiconductor switching element 6 is performed with PWM control. The PWM control is performed according to the PWM signal.

The driving circuit 3 increases a gate voltage of the semiconductor switching element 6 that takes a ground potential as a reference. Accordingly, in the semiconductor switching element 6, its gate voltage that takes its source voltage as a reference becomes higher than or equal to a fixed voltage, and thus the semiconductor switching element 6 turns on. If the semiconductor switching element 6 is on, a current flows from the plus terminal of the battery 7 to the semiconductor switching element 6, the shunt resistor 8, and the load 10 in this order, and the battery 7 supplies the power to the load 10 via the semiconductor switching element 6. Also, the driving circuit 3 decreases the gate voltage of the semiconductor switching element 6 that takes the ground potential as a reference. As a result, in the semiconductor switching element 6, its gate voltage that takes its source voltage as a reference becomes lower than the fixed voltage, and thus the semiconductor switching element turns off. If the semiconductor switching element 6 is off, no current flows between the drain and source of the semiconductor switching element 6, and thus power supply to the load 10 is stopped.

Both terminals of the shunt resistor (current circuit) 8 are respectively connected to the current detection unit (current circuit) 5. A shunt current whose current value is proportional to a current value of a current flowing through the shunt resistor 8 is output from the current detection unit 5. A current value of the shunt current is, for example, a predetermined fraction of a current value of the current flowing through the shunt resistor 8. Accordingly, the larger the current value of the current flowing via the semiconductor switching element 6 and the shunt resistor 8 is, the larger the current value of the shunt current is. The shunt current that the current detection unit 5 outputs flows to a ground terminal through the resistor 11, and current-voltage conversion of the shunt current is performed.

A low pass filter in which the resistor 12 and the capacitor 13 are connected in series is connected to the resistor 11 in parallel. The resistors 11 and 12 and the capacitor 13 constitute a filter circuit. The resistor 11 performs current-voltage conversion of the shunt current, and the converted voltage is filtered by the low pass filter (12 and 13). The voltage filtered by the low pass filter (12 and 13) is provided to the overcurrent protection unit 4 and the microcomputer 1. The larger the current value of the shunt current is, the larger a voltage value of the voltage filtered by the low pass filter (12 and 13) is.

If the voltage value of the voltage filtered by the low pass filter (12 and 13) exceeds a predetermined voltage value corresponding to an overcurrent, the overcurrent protection unit (overcurrent protection circuit) 4 turns off the semiconductor switching element 6 for protecting it through the driving circuit 3. At this time, regardless of the PWM signal that is output from the microcomputer 1, the driving circuit 3 turns off the semiconductor switching element 6. If the voltage value of the voltage filtered by the low pass filter (12 and 13) is lower than or equal to the predetermined voltage value, the driving circuit 3 turns on or off the semiconductor switching element 6 in accordance with the PWM signal that is provided from the output terminal 15 of the microcomputer 1.

The microcomputer 1 includes an A/D (Analog/Digital) conversion units 14 and 2 that convert an analog value to a digital value and the output terminal 15. The microcomputer 1 obtains the voltage value of the voltage filtered by the low pass filter (12 and 13) via the A/D conversion unit 2 at a timing of the region near the end of each pulse of the PWM signals that are output from its output terminal 15 (voltage detection unit). Here, the region near the end of each pulse is desirably a period starting at a point in time that is up to 1% of the time of the corresponding cycle prior to the end of the pulse, and ending at that end of the pulse. When the cycle of the PWMs signal is 100 ms, for example, the region near a pulse end is a period of 1 ms before the end of the pulse arrives. Note, that the region near the end of each pulse may also include a period before and after that end.

Based on the voltage value obtained by the A/D conversion unit 2, the microcomputer 1 estimates an electric wire temperature of the electric wire through which a current flows that also flows through the semiconductor switching element 6 (temperature estimation unit). The semiconductor switching element 6 and the shunt resistor 8 are provided partway along the electric wire. Note that, as an estimation method for estimating an electric wire temperature, for example, the estimation method performed in an electric wire protection apparatus for a vehicle that is disclosed in Patent Document 1 can be used.

If the estimated electric wire temperature exceeds a predetermined temperature, the microcomputer 1 turns off the semiconductor switching element 6 through its output terminal 15 and the driving circuit 3 (electric wire protection unit). At this time, the microcomputer 1 turns off the semiconductor switching element 6 by switching the voltage indicated by the PWM signal to a low-level voltage. After this, the microcomputer 1 maintains the voltage indicated by the PWM signal at a low-level voltage. The microcomputer 1 obtains a voltage value of the battery 7 serving as a power source (hereinafter, referred to as "power-source voltage value") through the A/D conversion unit 14. Based on the obtained power-source voltage value and a predetermined voltage value that is to be applied to the load 10, the microcomputer 1 calculates a duty ratio of the PWM signal. The microcomputer 1 calculates, for example, the duty ratio using the following formula: (predetermined voltage value/power-source voltage value)×100%.

The microcomputer 1 outputs a PWM signal that is in accordance with the calculated duty ratio from its output terminal 15 and provides the PWM signal to the driving circuit 3. At this time, the duty ratio of the PWM signal corresponds to the duty ratio that is calculated by the microcomputer 1. The duty ratio shows a ratio of a period for which the PWM signal indicates a high-level voltage in one cycle. If the microcomputer 1 calculates the duty ratio using the above-mentioned formula, even if the power-source voltage value varies, an average voltage value of the voltage that is applied to the load 10 is maintained at the predetermined voltage value.

Note that the microcomputer 1 outputs, from its output terminal 15, PWM signals in which the end of each cycle coincides with the end of each pulse. In other words, in the PWM signals, the duty ratio is adjusted by adjusting a point in time when its voltage switches from a low-level voltage to a high-level voltage, and the switching from a high-level voltage to a low-level voltage is periodically performed. Based on the PWM signal that is provided from the microcomputer 1, the driving circuit 3 switches, as described above, the semiconductor switching element 6 on or off. Accordingly, the switching of the semiconductor switching element 6 from on to off is periodically performed and the duty ratio is adjusted by adjusting the point in time of switching from off to on.

Hereinafter, operations of the power supply control apparatus configured in this manner will be described. The microcomputer 1 obtains a voltage value of the battery 7 through the A/D conversion unit 14. Then, based on the obtained power-source voltage value and the predetermined voltage value, the microcomputer 1 calculates the duty ratio of the PWM signal and outputs, from its output terminal 15, the PWM signals that are in accordance with the calculated duty ratio. Based on the PWM signal that is provided from the microcomputer 1, the driving circuit 3 switches the semiconductor switching element 6 on or off.

Figure 3:
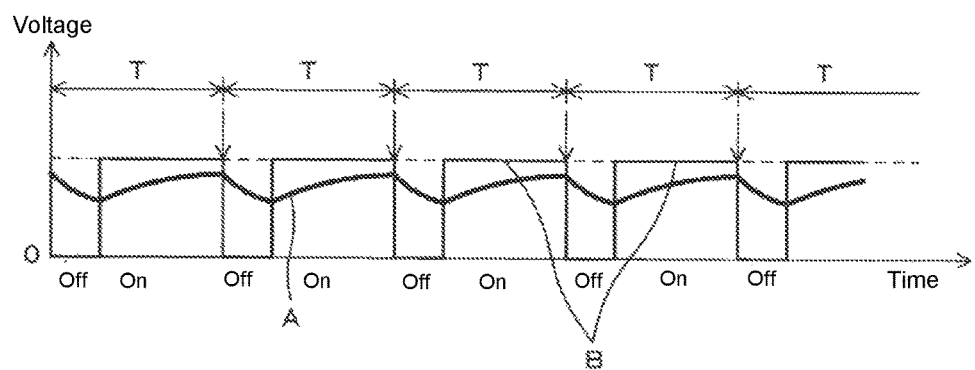
FIG. 3 is a waveform diagram of a voltage waveform of a voltage in which a shunt current that is output from a current detection unit is converted by a resistor.

The current detection unit 5 outputs a shunt current whose current value is proportional to a current value of a current that flows through the semiconductor switching element 6 and is supplied to the load 10, and the shunt current that was output is converted to a voltage by the resistor 11. The voltage converted by the resistor 11 is filtered by the low pass filter (12 and 13). FIG. 3 is a waveform diagram of a voltage waveform of a voltage in which the shunt current that is output from the current detection unit 5 is converted by the resistor 11. Here, A is an example of a voltage waveform of a voltage that is filtered by the low pass filter (12 and 13), whereas B is an example of a voltage waveform in a case where the low pass filter (12 and 13) does not exist and filtering is not performed.

If the voltage value of the voltage filtered by the low pass filter (12 and 13) exceeds the predetermined voltage value corresponding to an overcurrent of the semiconductor switching element 6, the overcurrent protection unit 4 turns off the semiconductor switching element 6 through the driving circuit 3. At this time, regardless of the PWM signal, the driving circuit 3 turns off the semiconductor switching element 6.

The low pass filter (12 and 13) filters the voltage converted by the resistor 11. Thus, if an inrush current flows to the load 10, the peak voltage of the voltage converted by the resistor 11 is suppressed. As a result, a case where the semiconductor switching element 6 turns off if inrush current flows to it is prevented.

As described above, the voltage value of the voltage filtered by the low pass filter (12 and 13) is represented by the product of a current value of the shunt current that is output from the current detection unit 5 and a resistance value across the resistor 11. The larger the power accumulated in the capacitor 13 is, the larger the resistance value across the resistor 11 is. If the power accumulated in the capacitor 13 is zero, the resistance value across the resistor 11 is substantially the same as a resistance value of a parallel circuit in which the resistors 11 and 12 are connected in parallel and becomes the smallest. Also, if power has been accumulated in the capacitor 13 and the voltage across the capacitor 13 is the same as a voltage across the resistor 11, the resistance value across the resistor 11 is substantially the same as the resistance value of the resistor 11 and becomes the largest.

If the semiconductor switching element 6 is on, the capacitor 13 is charged, whereas if the semiconductor switching element 6 is off, a current flows from the capacitor 13 to the resistors 12 and 11 in this order, and thus the capacitor 13 discharges power. At a point in time when the semiconductor switching element 6 turns from off to on for starting the load 10, the semiconductor switching element 6 has been off for a long period of time, and thus the power accumulated in the capacitor 13 is very low. Accordingly, the resistance value across the resistor 11 is very small. As a result, the current value of the shunt current that is necessary for the voltage value of the voltage filtered by the low pass filter (12 and 13) to reach the predetermined voltage value is large. As described above, the current value of the shunt current that is output from the current detection unit 5 is proportional to the current value of the current flowing through the shunt resistor 8. Accordingly, if the semiconductor switching element 6 turns from off to on for starting the load 10, the upper limit value of the current that can flow via the semiconductor switching element 6 is large.

The waveform of PWM signals that the microcomputer 1 outputs is substantially the same as the waveform B as shown in FIG. 3. As described above, the microcomputer 1 obtains the voltage value of the voltage filtered by the low pass filter (12 and 13) through the A/D conversion unit 2 at the timing near the end of each pulse of PWM signals. The region near the end of each pulse is, for example, a period starting at a point in time that is up to 1% of the time of the corresponding cycle prior to the end of the pulse, and ending at that end of the pulse. The timing near the end of each pulse coincides with the timing shown with the arrow in FIG. 3. Note that, as described above, in the PWM signals that are output from the output terminal 15 of the microcomputer 1, the end of the cycles T coincides with the end of the pulses.

If the semiconductor switching element 6 is off, no current is output from the current detection unit 5, and thus the capacitor 13 discharges power and the voltage value of the voltage filtered by the low pass filter (12 and 13) gradually decreases. If the semiconductor switching element 6 is on, the shunt current is output from the current detection unit 5, and thus the capacitor 13 is charged and the voltage value of the voltage filtered by the low pass filter (12 and 13) gradually increases.

The microcomputer 1 obtains, as described above, the voltage value of the voltage filtered by the low pass filter (12 and 13) at the timing near the end of each pulse of the PWM signals. Accordingly, the microcomputer 1 can obtain approximately the maximum value of the voltage value of the voltage filtered by the low pass filter (12 and 13). This maximum value shows a current value larger than an actual current value (average current value) of the current flowing through the electric wire.

Based on the voltage value obtained by the A/D conversion unit 2, the microcomputer 1 estimates an electric wire temperature of the electric wire through which a current flows that also flows through the semiconductor switching element 6. If the estimated electric wire temperature exceeds the predetermined temperature, the microcomputer 1 turns off the semiconductor switching element 6 through its output terminal 15. At this time, the microcomputer 1 turns off the semiconductor switching element 6 by switching a voltage indicated by the PWM signal to a low-level voltage. Here, as described above, based on the voltage value that shows a larger current value than the actual current value (average current value) flowing through the electric wire, the electric wire temperature is estimated, and thus the semiconductor switching element 6 can be reliably turned off before the electric wire develops smoke.

Note that, depending on the relationship between a time constant of the low pass filter, the cycle T and the duty ratio of the PWM signal, there is a possibility that the microcomputer 1 obtains a voltage value that shows a smaller current value than the average current value. For this reason, regarding the time constant of the low pass filter and the cycle T of the PWM signal, which are predetermined, it is required to determine the minimum duty ratio that can be used.

Figure 4:
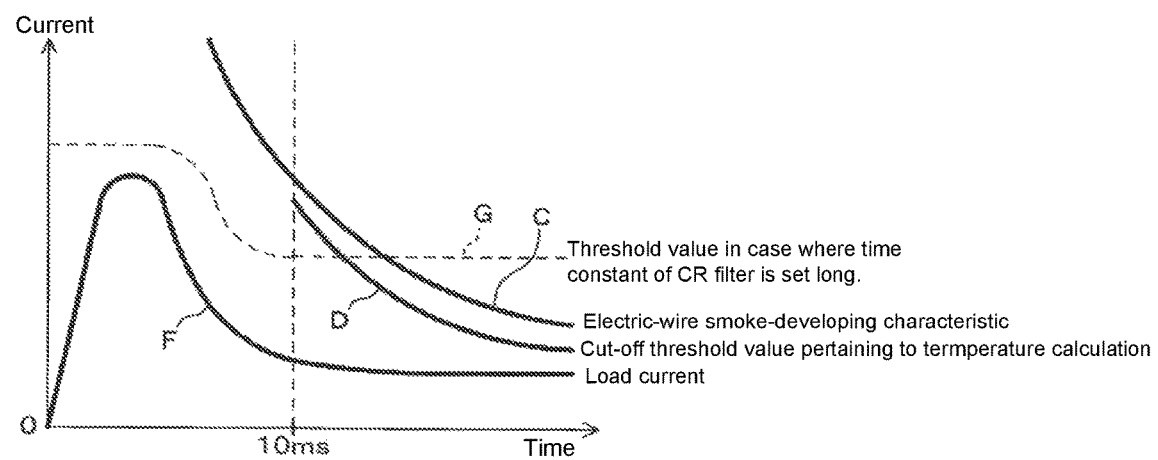
FIG. 4 is a graph showing an example of an overcurrent protection characteristic of the power supply control apparatus and the smoke-developing characteristic of the electric wire.

FIG. 4 is a graph showing an example of an overcurrent protection characteristic of this power supply control apparatus and the smoke-developing characteristic of the electric wire. In this graph, the flow-through current value of the electric wire is marked on the vertical axis and time or continuous flow-through time of the flow-through current is marked on the horizontal axis. The waveform F shows a load current including an inrush current, with time being marked on the horizontal axis. Any point, given by flow-through current value and flow-through time, on the upper right of an electric-wire smoke-developing characteristic curve C, leads to smoke development of the material covering the electric wire develops smoke due to overheating. The electric-wire smoke-developing characteristic curve C shows an electric-wire temperature at which development of smoke starts in the curve that shows the electric-wire temperature in a case where a current flows for the flow-through time.

In this power supply control apparatus, the curve D showing a cut-off threshold value obtained by a temperature calculation via the microcomputer 1 is defined for a slightly lower temperature (on the lower current side and shorter time side) of the electric-wire smoke-developing characteristic curve C. In this case, as shown in the electric-wire smoke-developing characteristic C, the larger the flow-through current value is, the shorter the flow-through time at which the electric wire starts to develop smoke is. In addition, in the power supply control apparatus, time for calculating an electric wire temperature is needed. Accordingly, the curve D showing the cut-off threshold value obtained by the temperature calculation is not set in the region in which the flow-through time is, for example, 10 milliseconds or shorter. Also, a threshold value (predetermined voltage value) G of the overcurrent protection unit 4 is set as a current value that is slightly lower than the cut-off threshold value pertaining to the temperature calculation performed by the microcomputer 1 in the case where the flow-through time is 10 milliseconds.

Here, the threshold value G of the overcurrent protection unit 4 is fixed, but it is suppressed so that a peak voltage of an inrush current does not exceed the electric-wire smoke-developing characteristic C using the low pass filter (CR filter) (12 and 13). The threshold value G of the overcurrent protection unit 4 is increased approximately by the amount of a voltage suppressed by the low pass filter (12 and 13). Note, that an inrush current in which the peak voltage is not suppressed flows through the semiconductor switching element 6. In this manner, in the region in which the cut-off threshold value D is not set, the threshold value G of the overcurrent protection unit 4 does not exceed the electric-wire smoke-developing characteristic C. Accordingly, also in this region, regardless of the flow-through time, the flow-through current value can exceed the threshold value G before it reaches the electric-wire smoke-developing characteristic C. Therefore, in this power supply control apparatus, the semiconductor switching element 6 and the electric wire can be protected for all load currents F including an inrush current.

The embodiment disclosed herein is an example in all respects, and is not to be construed as limiting. The scope of the present description is defined by the claims, rather than the above description, and is intended to include all modifications which fall within the scope of the claims and the meaning and scope of equivalents thereof.

LIST OF REFERENCE NUMERALS

1 Microcomputer (PWM signal output unit, temperature estimation unit, electric wire protection unit)
2 A/D conversion unit (voltage detection unit)
3 Driving circuit
4 Overcurrent protection unit (overcurrent protection circuit)
5 Current detection unit (current circuit)
Semiconductor switching element
7 Battery
8 Shunt resistor (current circuit)
10 Load
11, 12 Resistor (filter circuit)
13 Capacitor (filter circuit)
14 A/D conversion unit
15 Output terminal

The invention claimed is:

1. A power supply control apparatus comprising:
    a semiconductor switching element configured to be switched with Pulse Width Modulation (PWM) control;
    a PWM signal output unit configured to output a PWM signal pertaining to the PWM control;
    a current circuit configured to output a current related to a current flowing through the semiconductor switching element;
    a filter circuit configured to convert the current that is output from the current circuit to a voltage and to filter the converted voltage;
    an overcurrent protection circuit configured to turn off the semiconductor switching element based on a voltage value of the voltage filtered by the filter circuit;
    a voltage detection unit configured to detect the voltage value of the voltage filtered by the filter circuit at a timing near an end of a pulse of the PWM signal;
    a temperature estimation unit configured to estimate, based on the voltage value detected by the voltage detection unit, a temperature of an electrical wire through which a current flows that also flows through the semiconductor switching element;
    an electric wire protection unit configured to turn off the semiconductor switching element based on the temperature estimated by the temperature estimation unit; and
    wherein the timing near the end of the pulse is a period starting at a point in time prior to the end of the pulse that is up to 1% of the time of a corresponding cycle of a prior pulse.

2. The power supply control apparatus according to claim 1, wherein the PWM signal output unit is configured to output the PWM signal in which an end of a cycle coincides with the end of a pulse.

* * * * *